(12) United States Patent
Kawano et al.

(10) Patent No.: US 6,452,827 B1
(45) Date of Patent: Sep. 17, 2002

(54) I/O CIRCUIT OF SEMICONDUCTOR INTEGRATED DEVICE

(75) Inventors: Harumi Kawano; Akihiro Sushihara, both of Miyazaki-gun (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/867,531

(22) Filed: May 31, 2001

Related U.S. Application Data (62) Division of application No. 09/335,785, filed on Jun. 18, 1999, now Pat. No. 6,269,042.

(30) Foreign Application Priority Data

Dec. 28, 1998 (JP) .......................................... 10-373243

(51) Int. Cl.[7] ................................................ G11C 5/02
(52) U.S. Cl. .......................................... 365/51; 365/63
(58) Field of Search ...................................... 365/51, 63

(56) References Cited

U.S. PATENT DOCUMENTS 6,031,394 A   2/2000  Cranford, Jr. et al. ........ 326/81
6,256,246 B1 * 7/2001  Ooishi ........................ 365/205
6,310,505 B1 * 10/2001 Ogawa et al. ............... 327/276
6,331,796 B1 * 12/2001 Hamada et al. ............. 327/208

OTHER PUBLICATIONS

Betty Prince, "Semiconductor Memories", 1983, Wiley, 2$^{nd}$ edition, pp. 162–165.*

* cited by examiner

Primary Examiner—M. Tran
(74) Attorney, Agent, or Firm—Volentine Francos, PLLC (57) ABSTRACT

An input circuit of a semiconductor integrated circuit device includes a PMOS transistor P11 provided between an internal power supply VDD and a node S13; a PMOS transistor P12 which is provided between a node I/O to which a signal is input from an external circuit and the node S13, a POS transistor P15 which is provided between the node S13 and the node W11; and NMOS transistor N16 which controls the potential of the node S11 on the basis of the potential of the node I/O; and a second circuit which controls the potential of a node S14 on the basis of the potential of the node I/O.

3 Claims, 4 Drawing Sheets

INPUT CIRCUIT OF FIRST EMBODIMENT

FIG. 1 INPUT CIRCUIT OF FIRST EMBODIMENT

FIG. 2

OUTPUT CIRCUIT OF FIRST EMBODIMENT

FIG.3   INPUT CIRCUIT OF THIRD EMBODIMENT

FIG. 4 CONVENTIONAL INPUT CIRCUIT

I/O CIRCUIT OF SEMICONDUCTOR
INTEGRATED DEVICE

CROSS-REFERENCE TO RELATED
APPLICATIONS

This is a Divisional of application Ser. No. 09/335,785, filed Jun. 18, 1999 now U.S. Pat. No. 6,269,042.

BACKGROUND OF THE INVENTION

1. Field of the Invention

The present invention relates to an I/O circuit of a semiconductor integrated circuit device whose I/O circuit is employed as an input circuit for inputting to an internal circuit of the semiconductor integrated circuit device, a signal input from an external circuit thereof, or as an output circuit forouteputting to the external circuit, a signal output from the internal circuit, and more particularly relates to the I/O circuit that operates effectively when a signal voltage higher than the voltage of an internal power supply of the semiconductor integrated circuit device is input from the external circuit.

2. Description of the Related Art

Figure 4:
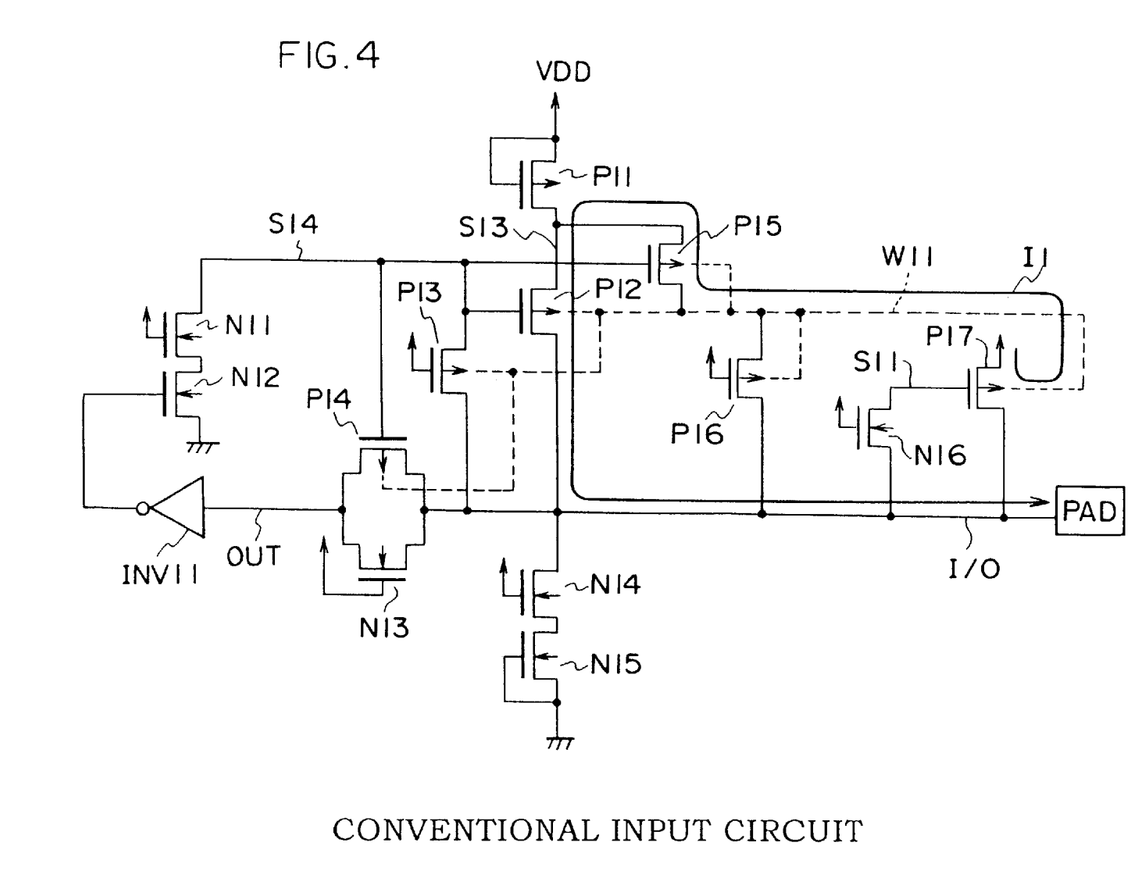
FIG. 4 is a circuit diagram of a conventional input circuit.

FIG. 4 shows a circuit diagram of a conventional input circuit. The input circuit of FIG. 4 is provided inside a semiconductor integrated circuit device (an LSI chip), and inputs a signal input from an external circuit to a pad electrode PAD, from a node OUT to an internal circuit of the LSI chip. An internal power supply VDD is 3[V]. The external circuit inputs a low level ("L" level) signal of 0[V] or a high level ("H" level) signal of 5[V] to a pad electrode PAD, or sets the pad electrode PAD at a high impedance ("Z" level). Here, the high impedance ("Z" level) means that the pad electrode PAD (node I/O) is floating with respect to the external circuit, and with respect to all of the circuits connected to the node (I/O).

In the input circuit in FIG. 4, PMOS transistor P11 and NMOS transistor N15 are OFF all the time. These transistors are provided such that the input circuit of FIG. 4 can be converted to be used as an output circuit easily. When the input circuit of FIG. 4 is used as an output circuit, the transistors are ON/OFF in accordance with a signal input from the internal circuit to respective gate electrodes.

Substrates of PMOS transistors P12 to P17 (N-well layers on which the PMOS transistors P12 to P17 are formed) are connected to a node W11 which is floating with respect to the internal power supply VDD. Accordingly, even when a signal voltage of 5[V], higher than the internal power supply VDD, is input to the pad electrode PAD, flowing of leakage current from the pad electrode PAD to the internal power supply VDD through a pn junction is prevented. The pn junction is formed by source or drain, and a substrate, N-well layer, of PMOS. Further, the PMOS transistors P12 and P15 are OFF when a signal voltage of 5[V] higher than the internal power supply VDD is input to the pad electrode PAD, thereby preventing electric current from flowing in reverse from the pad electrode PAD to the internal power supply VDD.

The PMOS transistors P13, P14, NMOS transistors N11 to N13, and an inverter INV11 convert a signal of 5[V], which was input from the external circuit to the pad electrode PAD, to a signal of substantially 3[V] on the basis of a VIH standard of an internal circuit, and inputs the converted signal to the internal circuit. The VIH standard is one determining voltage tolerance of an "H" level input signal.

The NMOS transistors N11 and N14 are provided so as to prevent a voltage greater than or equal to the internal power supply VDD from being applied through drain-source, gate-drain, and gate-source, of each of the NMOS transistors N12 and N15 when a signal of 5[V] is input to the pad electrode PAD. Accordingly, the NMOS transistors N11 and N14 can deal even with an LSI chip manufactured through a process in which voltage tolerance is low.

The PMOS transistor P16 is ON when a signal of 5[V] is input to the pad electrode PAD, and sets the node W11, each substrate of the PMOS transistors P12 to P17, at 5[V].

NMOS transistor N16 and PMOS transistor P17 clamp the node I/O at substantially 3[V] when the pad electrode PAD is at the "Z" level. Further, since the PMOS transistor P17 is ON when the pad electrode PAD is 0[V] (the "L" level) or 5[V] (the "H" level), electric current flows between the internal power supply VDD and the pad electrode PAD through a source-drain of the PMOS transistor P17.

However, in the above-described conventional circuit, when the pad electrode PAD is at the "L" level, a node S14 is at the "L" level, and the PMOS transistors P12 and P15 are ON, an electric current route I1 (see FIG. 4) of [VDD]-[source of P17]-[substrate of P17]-[W11]-[drain of P15]-[S13]-[P12]-[PAD] is formed. Accordingly, there has been a problem in that electric current flowing into the pad electrode PAD becomes larger than a predetermined value (the value of current flowing through the source-drain of the PMOS transistor P17), and consumption of electric current thereby increases. Moreover, the PMOS transistor P15 is provided so as to set the node W11 at the same potential as the internal power supply VDD when the circuit of FIG. 4 is used as an output circuit and the PMOS transistor P11 is ON.

When the pad electrode PAD changes from the "L" level to the "Z" level, the potential of the node I/O is increased by the PMOS transistor P17. However, there have been problems, described below. Namely, as the potential of the node I/O nears the potential of the internal power supply VDD, the potential of the node S11 also increases, electric current characteristics of the PMOS transistor P17 thereby deteriorate, and it takes more time until the node I/O reaches the potential of the internal power supply VDD as compared to a case in which a pull-up transistor (in which the gate electrode of the PMOS transistor P17 is fixed at the "L" level) having the same dimensions as the PMOS transistor P17 is employed. Further, because increasing dimensions of the PMOS transistor P17 means increasing electric current consumption, it is not preferable.

Since PMOS and NMOS usually have different thresholds, there have been problems in that, according to a combination of thresholds of the PMOS transistor P17 and the NMOS transistor N16, the PMOS transistor P17 may be OFF before the node I/O increases to the potential of the internal power supply VDD (3[V]) so that the node I/O does not reach to the power supply potential. If the node I/O does not reach the power supply potential (3[V]), a drawback is generated in that a margin for the VIH standard of a signal input from a node OUT to the internal circuit is reduced, or the like.

In order to solve such a conventional problem as described above, the present invention is achieved, and it is an object of the present invention to reduce electric current consumption. Further, it is another object of the present invention to set this node at the potential of the internal power supply reliably when a connecting node of an external circuit is at high impedance.

SUMMARY OF THE INVENTION

In order to accomplish the above-described objects, in accordance with an aspect of the present invention, there is provided an I/O circuit of a semiconductor integrated circuit device, comprising: a first MOS transistor (P11) whose gate electrode is connected to a first node (IN1) to which a first signal is input from at least one of a first power supply (VDD) and an internal circuit, of the semiconductor integrated circuit device, whose first electrode and substrate are connected to said first power supply, and whose second electrode is connected to a second node (S13); a second MOS transistor (P12) whose first electrode is connected to said second node, whose gate electrode is connected to a third node (S14), whose second electrode is connected to a fourth node (I/O) to which a signal is either input from an external circuit or from which a signal is output to the external circuit, and whose substrate is connected to a fifth node (W11) which is floating with respect to said first power supply; a third MOS transistor (P15) whose first electrode is connected to said second node, whose gate electrode is connected to the third node, and whose second electrode and substrate are connected to the fifth node; a fourth MOS transistor (P17) whose first electrode is connected to the fourth node, whose gate electrode is connected to a sixth node (S11), whose second electrode is connected to the first power supply, and whose substrate is connected to the fifth node; a first control circuit which controls the potential of the sixth node (S11) in accordance with the potential of the fourth node (I/O); and a second control circuit which controls the potential of the third node (S14) in accordance with the potential of the fourth node (I/O), wherein any of a connection of the fourth node (I/O) and the second electrode of the second MOS transistor (P12), a connection of the first electrode of the second MOS transistor (P12) and the first electrode of the third MOS transistor (P15), a connection of the second electrode of the third MOS transistor (P15) and the fifth node (W11) and a connection of the second electrode of the fourth MOS transistor (P17) and the first power supply (VDD) is disconnected.

In accordance with another aspect of the present invention, there is provided an I/O circuit of a semiconductor integrated circuit device according to claim 1, wherein the first control circuit comprises: a sixth MOS transistor (P28) whose gate electrode is connected to the first power supply, whose first electrode is connected to the fourth node, whose second electrode is connected to the sixth node, and whose substrate is connected to the fifth node a seventh MOS transistor (N27) whose gate electrode is connected to the first power supply, whose first electrode is connected to a second power supply (GND), and whose second electrode is connected to a seventh node (S21); and an eighth MOS transistor (N26) whose gate electrode is connected to the first power supply, whose first electrode is connected to the seventh node, and whose second electrode is connected to the sixth node.

DESCRIPTION OF THE PREFERRED EMBODIMENTS

First Embodiment

Figure 1:
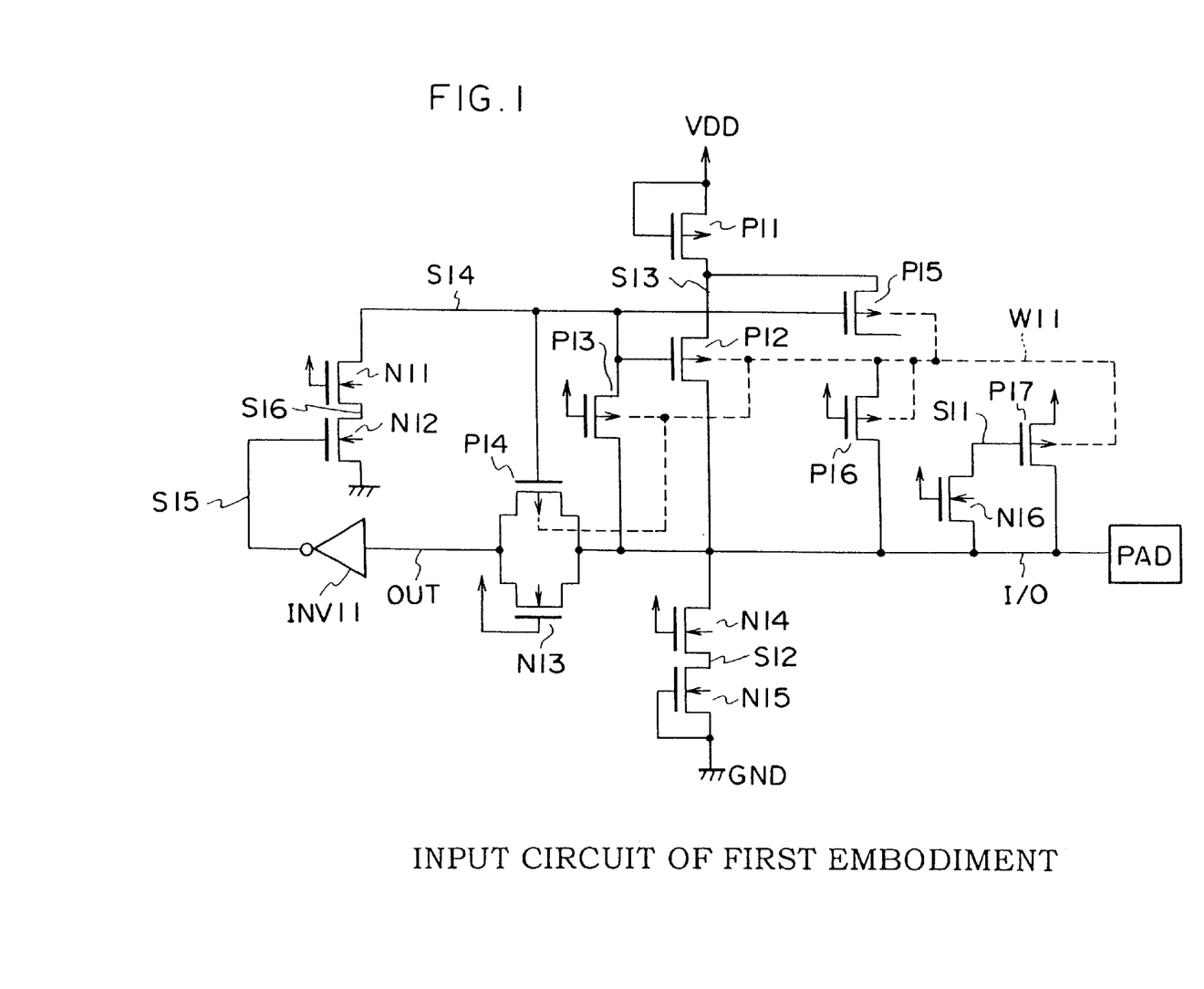
FIG. 1 is a circuit diagram of an input circuit according to a first embodiment of the present invention.

FIG. 1 is a circuit diagram of an input circuit according to a first embodiment of the present invention. The input circuit in FIG. 1 is built into an LSI chip, and comprises PMOS transistors P11 to P17, NMOS transistors N11 to N16, and an inverter INV 11. The input circuit in FIG. 1 inputs a signal, which was input from a circuit provided outside the LSI chip (an external circuit) to a pad electrode (a node I/O), from a node OUT to a circuit built into the LSI chip (an internal circuit). The internal power supply VDD of the aforementioned LSI chip is 3[V]. Further, an "H" level of a signal input from the external circuit is 5[V].

Figure 2:
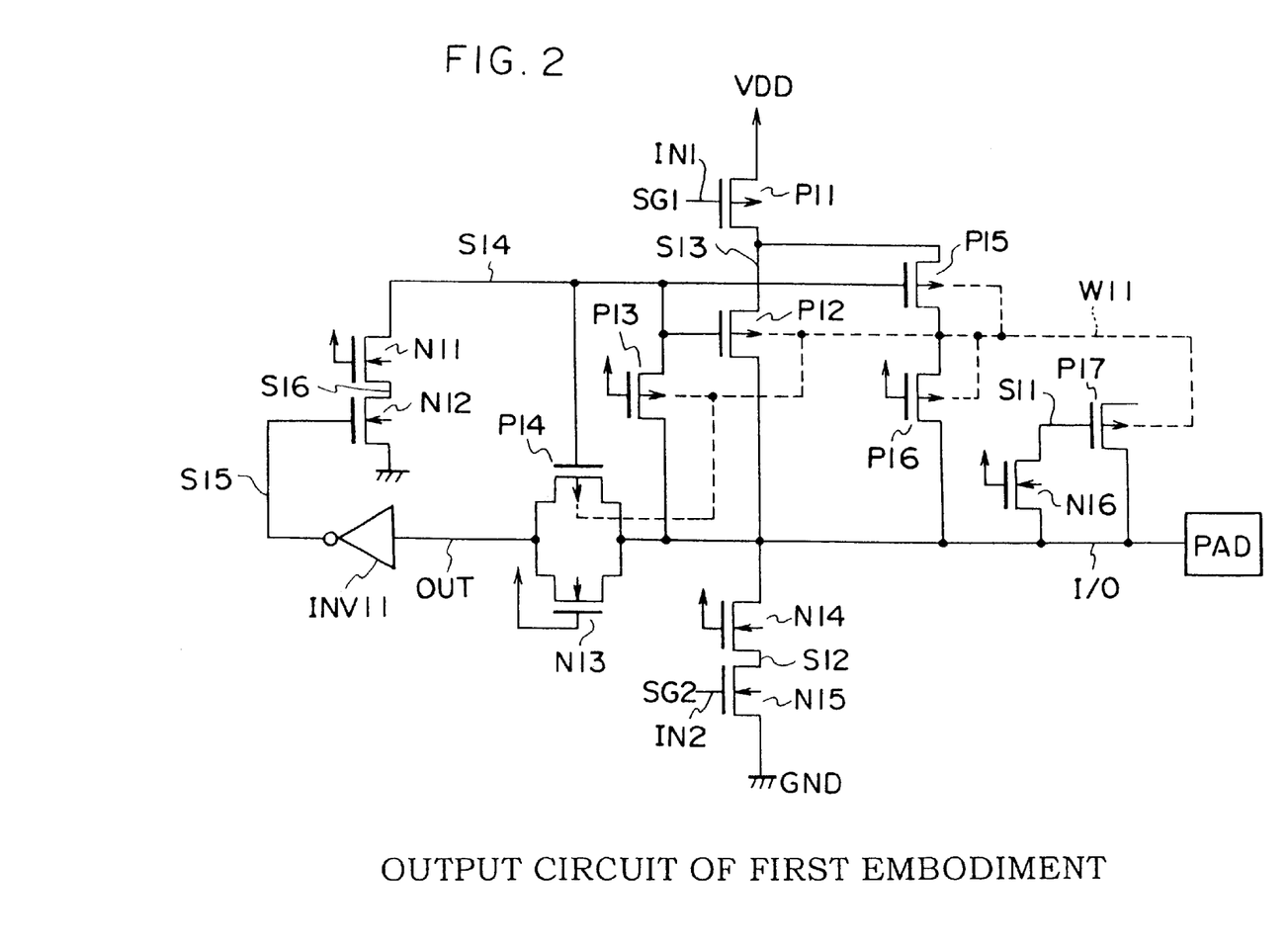
FIG. 2 is a circuit diagram of an output circuit according to the first embodiment of the present invention.

FIG. 2 is a circuit diagram of an output circuit according to the first embodiment of the present invention, and is one that has been converted from the input circuit of FIG. 1. Further, in FIG. 2, portions identical to those shown in FIG. 1 are denoted by the same reference numerals. In the same manner as the input circuit of FIG. 1, the output circuit of FIG. 2 is also built into the LSI chip, and comprises the PMOS transistors P11 to P17, the NMOS transistors N11 to N16, and the inverter INV 11. The output circuit of FIG. 2 outputs a signal output from the internal circuit of the LSI chip to nodes IN1 and IN2, from a pad electrode PAD to the external circuit. The internal power supply VDD of the LSI chip is 3[V] which is the same as in FIG. 1.

In the input circuit of FIG. 1, as for the PMOS transistor P14, a gate electrode thereof is connected to a node S14, a source electrode thereof is connected to the node I/O, a drain electrode thereof is connected to the node OUT, and a substrate, a N-well layer having the PMOS transistor P14 formed therein, thereof is connected to a node W11 which is floating with respect to the internal power supply VDD and a ground power supply GND. Further, as for the NMOS transistor N13, a gate electrode thereof is connected to the internal power supply VDD, a drain electrode thereof is connected to the node I/O, a source electrode thereof is connected to an output terminal OUT, and a substrate thereof is connected to the ground power supply GND.

In the input circuit of FIG. 1, as for the PMOS transistor P13, a gate electrode thereof is connected to the internal power supply VDD, a source electrode thereof is connected to the node I/O, a drain electrode thereof is connected to the node S14, and a substrate thereof is connected to the node W11.

In the input circuit of FIG. 1, as for the inverter INV11, an input electrode thereof is connected to the node OUT, and an output electrode thereof is connected to a node S15. Further, as for the NMOS transistor N12, a gate electrode thereof is connected to the node S15, a source electrode and a substrate thereof are connected to the ground power supply GND, and a drain electrode thereof is connected to a node S16. Further, as for the NMOS transistor N11, a gate electrode thereof is connected to the internal power supply VDD, a source electrode and a substrate thereof are connected to the node S16, and a drain electrode thereof is connected to the node S14.

When a voltage greater than or equal to the internal power supply VDD (3[V]) is input from the external circuit to the pad electrode PAD, the PMOS transistors P13 and P14, the NMOS transistors N11 to N13, and the inverter INV11 fix the node OUT at a potential of the internal power supply VDD (3[V]), and input a signal that satisfies the VIH standard of the internal circuit, from the node OUT to the internal circuit. Further, the PMOS transistors P13 and P14, the NMOS transistors N11 to N13, and the inverter INV11 form a second control circuit for controlling the potential of the node S14 in accordance with the potential of the node I/O.

The NMOS transistor N11 is provided so as to prevent the aforementioned voltage from being applied through a drain-source of the NMOS transistor N12 when a voltage greater than the internal power supply VDD is input from the external circuit to the pad electrode PAD and the potential of the node S14 thereby becomes larger than the internal power supply VDD.

In the input circuit of FIG. 1, a gate electrode, a source electrode, and a substrate of the PMOS transistor P11 are connected to the internal power supply VDD, and a drain electrode thereof is connected to a node S13. Further, as for the PMOS transistor P12, a gate electrode thereof is connected to the node S14, a source electrode thereof is connected to the node S13, a drain electrode thereof is connected to the node I/O, and a substrate thereof is connected to the node W11.

In the input circuit of FIG. 1, as for the NMOS transistor N14, a gate electrode thereof is connected to the internal power supply VDD, a drain electrode thereof is connected to the node I/O, and a source electrode and a substrate, a P-well layer having the NMOS transistor N14 formed therein, are connected to the node S16. Further, as for the NMOS transistor N15, a drain electrode thereof is connected to a node S12, and a gate electrode, a source electrode, and a substrate thereof are connected to the ground power supply GND.

When the input circuit of FIG. 1 is used as an output circuit (see FIG. 2), the PMOS transistor P11 and the NMOS transistor N15 are transistors that are ON/OFF in accordance with a signal input from the internal circuit. In FIG. 1, the PMOS transistor P11 is OFF all the time, and the NMOS transistor N15 is OFF all the time except when it operates as a protective circuit.

The PMOS transistor P12 is provided so as to prevent a pn junction of a drain electrode and a substrate of the PMOS transistor P11 from being biased forward and to prevent electric current (which is simply referred to as "current" hereinafter) from flowing reversely from the pad electrode PAD to the internal power supply VDD, when a voltage greater than the internal power supply VDD is input from the external circuit to the pad electrode PAD.

The NMOS transistor N14 is provided so as to prevent a voltage greater than or equal to this internal power supply VDD from being applied through a drain-source of the NMOS transistor N15 when a voltage greater than or equal to the internal power supply VDD is input from the external circuit to the pad electrode PAD.

When a negative voltage is input to the pad electrode PAD, the NMOS transistors N14 and N15 cause electric current to flow from the ground power supply GND to the pad electrode PAD by the NMOS transistor N15 being ON, and thereby function as a protective circuit which clamps the pad electrode PAD at the potential of the ground power supply GND.

In the input circuit of FIG. 1, as for the NMOS transistor N16, a gate electrode thereof is connected to the internal power supply VDD, a source electrode thereof is connected to a node S11, a drain electrode thereof is connected to the node I/O, and a substrate thereof is connected to the ground power supply GND. Further, as for the PMOS transistor P17, a gate electrode thereof is connected to the node S11, a drain electrode thereof is connected to the node I/O, a source electrode thereof is connected to the internal power supply VDD, and a substrate thereof is connected to the node W11.

The NMOS transistor N16 and the PMOS transistor P17 form a pull-up circuit that sets the potential of the node I/O at a potential of the internal power supply VDD, when the pad electrode PAD is at the a "Z" level (high impedance). Further, the NMOS transistor N16 corresponds to a first control circuit which controls the potential of the node S11 on the basis of the potential of the node I/O.

In the input circuit of FIG. 1, as for the PMOS transistor P15, a gate electrode thereof is connected to the node S14, a source electrode thereof is connected to the node S13, a drain electrode thereof is floating, and a substrate thereof is connected to the node W11. Further, as for the PMOS transistor P16, a gate electrode thereof is connected to the internal power supply VDD, a source electrode thereof is connected to the node I/O, and a drain electrode and a substrate thereof are connected to the node W11.

If the input circuit of FIG. 1 is employed as the output circuit (see FIG. 2), the aforementioned PMOS transistor P15 sets the potential of the node W11 at the potential of the internal power supply VDD when the drain electrode of the PMOS transistor P15 is connected to the node W11 and the PMOS transistor P11 is ON. In FIG. 1, because the drain electrode of the PMOS transistor P15 and the node W11 are disconnected, even when the PMOS transistor P15 is ON, the potential of the node W11 is not equal to that of the node S13.

The PMOS transistor P16 is ON when a voltage greater than or equal to the internal power supply VDD is applied from the external circuit to the pad electrode PAD, and thereby sets the potential of a N-well layer connected to the node W11 at a potential equal to that of the pad electrode PAD. Further, the drain electrode of the PMOS transistor P16 is separated from the node W11 and instead, may be connected to the drain electrode of the PMOS transistor P15. In this case, when a voltage greater than or equal to the internal power supply VDD is input from the external circuit to the pad electrode PAD, the potential of the node W11 becomes substantially equal to that of the pad electrode PAD, through a pn junction which is formed by the substrate, the N-well layer, and a source or a drain of each of the PMOS transistors P12 to P14, P16, and P17 at a side where the source or the drain is connected to the node I/O.

In the aforementioned PMOS transistors P12 to P17, because the N-well layers which are the substrates of the PMOS transistors P12 to P17 (the node w11) are not connected to the internal power supply VDD, even when a voltage greater than the internal power supply VDD is input from the external circuit to the pad electrode PAD, leakage electric current does not flow from the pad electrode PAD to the internal power supply VDD through the pn junction which is formed by the substrate, the N-well layer, and a source or a drain of each of the PMOS transistors P12 to P17 at a side at which the source or the drain thereof is connected to the node I/O.

In the output circuit of FIG. 2, in a different manner from FIG. 1, the gate electrode of the PMOS transistor P11 is connected to a node IN1. Further, in contrast with FIG. 1, in the output circuit of FIG. 2, the gate electrode of the NMOS transistor N15 is connected to a node IN2.

A first signal SG1 is input from the internal circuit to the node IN1, and a second signal SG2 is input from the internal circuit to the node IN2. At this time, each of the signal SG1 and the signal SG2 is a "L" level signal (0[V]) or each is a "H" level signal (3[V]), but SG1="L" and SG2="H" does not occur. Accordingly, the PMOS transistor P11 and the NMOS transistor N15 are not ON at the same time.

In the output circuit of FIG. 2, in contrast with FIG. 1, the drain electrode of the PMOS transistor P15 is connected to the node W11. Further, in contrast with FIG. 1, the source electrode of the PMOS transistor P17 is not connected to the internal power supply VDD, and is floating.

Next, an operation of the input circuit of FIG. 1 will be described. First, when the pad electrode PAD (the node I/O)

is at a "H" level (5[V]), the PMOS transistors P13 and P16 are ON, while the node S14 and the node W11 are 5[V], equal to that of the pad electrode PAD (the node I/O). Further, the PMOS transistors P12 and P15 are OFF. Moreover, the potential of the node S13 is less than or equal to 3[V]+Vthp (Vthp is a threshold of PMOS) and the PMOS transistor P11 is OFF.

Further, the PMOS transistor P14 and the NMOS transistor N13 are OFF. However, when the potential of the node OUT decreases to 3[V]-Vthn (Vthn is a threshold of NMOS), the potential of the node OUT is fixed at 3[V]-Vthn by a source follower operation of the NMOS transistor N13. Further, the node S15 is at a "L" level, while the NMOS transistor N12 is OFF.

The potential of the node S11 is fixed at 3[V]-Vthn by a source follower operation of the NMOS transistor N16, and the PMOS transistor P17 is ON, and electric current flows from the pad electrode PAD to the internal power supply VDD through the drain-source of the PMOS transistor P17.

Next, after the pad electrode PAD (the node I/O) has changed from the "H" level (5[V]) to the "L" level, the PMOS transistors P13 and P16 turn OFF. The potential of the node W11 is equal to 3[V]+Vthp (Vthp is a threshold of PMOS) by the PMOS transistor P16 being OFF.

The NMOS transistor N13 turns ON, the node OUT becomes the "L" level, the node S15 comes to the "H" level (3[V]), and the NMOS transistor N12 turns ON. Accordingly, the node S14 becomes the "L" level. Further, the PMOS transistors P12 and P15 turn ON when the node S14 is at the "L" level, and later turn OFF.

The NMOS transistor N16 turns ON, the node S11 becomes the "L" level, and as a result, the PMOS transistor P17 remains ON and electric current flows from the internal power supply VDD to the pad electrode PAD through the source-drain of the PMOS transistor P17.

In the conventional input circuit of FIG. 4, when the pad electrode PAD was at the "L" level, an electric current route of [VDD]-[the source of P17]-[the substrate of P17]-[W11]-[the drain of P15]-[S13]-[P12]-[PAD] was formed, and excessive electric current flowed from the internal power supply VDD to the pad electrode PAD. However, in the input circuit of FIG. 1, because the drain electrode of the PMOS transistor P15 and the node W11 are separated from each other, the aforementioned electric current route is not formed so that excessive electric current does not flow from the internal power supply VDD to the pad electrode PAD.

Next, after the pad electrode PAD has changed from the "L" level (0[V]) to the "Z" level (high impedance), the potential of the pad electrode PAD (the node I/O) increases due to the current flowing to the pad electrode PAD through the source-drain of the PMOS transistor P17. In accordance with this, the potential of the node S11 becomes 3[V]-Vthn. If the threshold Vthn of NMOS is greater than the threshold Vthp of PMOS, the potential of the pad electrode PAD is 3[V]. Further, if the threshold Vthn of NMOS is less than or equal to the threshold Vthp of PMOS, the potential of the pad electrode PAD becomes equal to 3[V]-Vthn.

The PMOS transistors P13 and P16 remain OFF. Further, the node S15 becomes the "L" level, and the NMOS transistor N12 turns ON. Accordingly, the node S14 becomes the "L" level, and the PMOS transistor P14 turns ON, and the node OUT obtains the same potential as the node I/O. Further, the node S14 becomes the "L" level, and as a result, the PMOS transistors P12 and P15 turn ON, and the node S13 obtains the same potential as the node I/O.

After the pad electrode PAD changes from the "H" level (5[V]) to the "Z" level (high impedance), electric current flows from the pad electrode PAD to the internal power supply VDD through the drain-source of the PMOS transistor P17, and the potential of the pad electrode PAD (the node I/O) thereby decreases. If the threshold Vthn of NMOS is greater than the threshold Vthp of PMOS, the PMOS transistor P17 remains ON, while the potential of the pad electrode PAD is 3[V]. Further, if the threshold Vthn of NMOS is less than or equal to the threshold Vthp of PMOS, the potential of the pad electrode PAD is equal to 3[V]-Vthn+Vthp.

The PMOS transistors P13 and P16 turn OFF; the potentials of the node S14 and the node W11 become 3[V]+Vthp. Further, the PMOS transistor P14 and the NMOS transistor N13 remain OFF.

An operation of the output circuit of FIG. 2 will be explained hereinafter. In the output circuit of FIG. 2, the potential of the pad electrode PAD does not increase to more than 3[V], the PMOS transistor P13 is OFF all the time, and the node S14 is at the "L" level all the time. When the signals SG1 and SG2 are at the "L" level (0[V]), the PMOS transistor P11 turns ON, and the NMOS transistor N15 turns OFF. The PMOS transistors P12 and P15 turn ON due to the PMOS transistor P11 being turned ON. The pad electrode PAD becomes the "H" level (3[V]) due to the PMOS transistor P12 being turned ON. Further, the node W11 becomes 3[V] due to the PMOS transistor P15 being turned ON. At this time, since the NMOS transistor N12 turns OFF, a circuit by which the node S14 is forced to be at the "L" level can be provided.

Further, when the signals SG1 and SG2 are at the "H" level (3[V]), since the PMOS transistor P11 turns OFF while the NMOS transistor N15 turns ON, the pad electrode PAD becomes the "L" level. At this time, in the output circuit of FIG. 2, since the source electrode of the PMOS transistor P17 and the internal power supply VDD are electrically separated from each other, the electric current route of [VDD]-[source of P17]-[substrate of P17]-[W11]-[drain of P15]-[S13]-[P12]-[PAD] is not formed, and excessive current does not flow from the internal power supply VDD to the pad electrode PAD.

When the signal SG1 is at the "H" level, and the signal SG2 is at the "L" level, since both the PMOS transistor P11 and the NMOS transistor N15 turn OFF, the pad electrode PAD becomes the "Z" level.

In this way, in accordance with the first embodiment of the present invention, because the drain electrode of the PMOS transistor P15 is separated from the node W11 to which the respective substrate, the N-well layer, of each of the PMOS transistors P12 to P17 are connected, even when the pad electrode PAD (the node I/O) is at the "L" level, the electric current route of [VDD]-[source of P17]-[substrate of P17]-[W11]-[drain of P15]-[S13]-[P12]-[PAD] is not formed. As a result, because excess electric current does not flow from the internal power supply VDD to the pad electrode PAD, consumption of electric current can be reduced.

In the input circuit of FIG. 1, in a state in which the drain electrode of the PMOS transistor P15 is not separated from the node W11, the source electrode of the PMOS transistor P15 or the source electrode of the PMOS transistor P12 may be separated from the node S13, or the drain electrode of the PMOS transistor P12 may be separated from the node I/O.

In the output circuit of FIG. 2, if it is necessary to fix the pad electrode PAD at the potential of the internal power supply VDD when the pad electrode PAD (the node I/O) is at the "Z" level (high impedance), and if it is not necessary to increase the node W11 to the potential of the internal power supply VDD when the PMOS transistor P11 is ON, in a state in which the source electrode of the PMOS transistor P17 is not separated from the internal power supply VDD, the drain electrode of the PMOS transistor P15 may be separated from the node W11 or the source electrode of the PMOS transistor P15 may be separated from the node S13.

In the output circuit of FIG. 2, a switching circuit may be provided between the drain electrode of the PMOS transistor P15 and the node W11 and between the source electrode of the PMOS transistor P17 and the internal power source VDD so as to operate as an input circuit when the PMOS transistor P11 and the NMOS transistor N15 are OFF. A function as an input circuit or an output circuit can be switched by this switching circuit.

Second Embodiment

Figure 3:
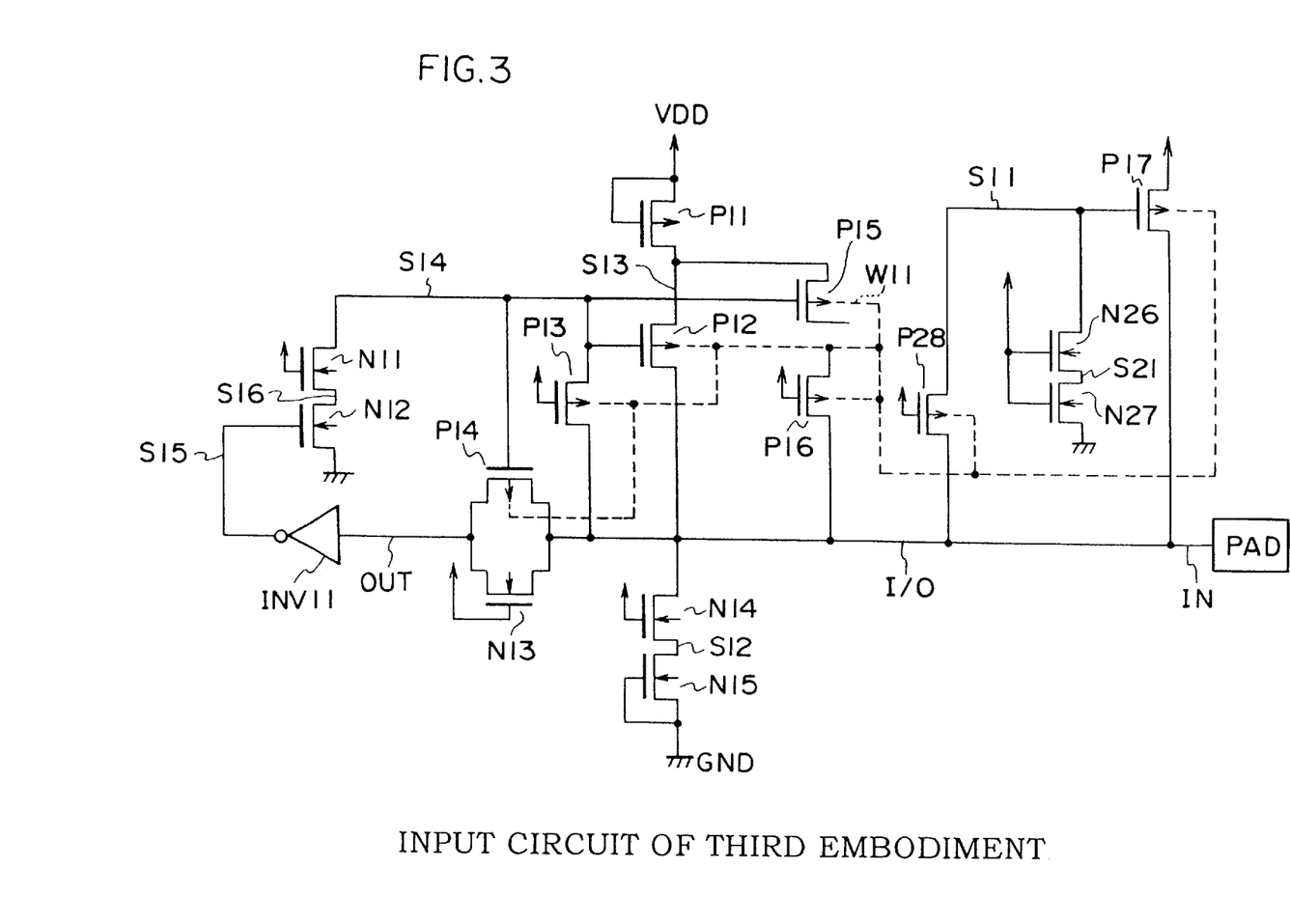
FIG. 3 is a circuit diagram of an input circuit according to a second embodiment of the present invention.

FIG. 3 is a circuit diagram of an input circuit according to a second embodiment of the present invention. In FIG. 3, portions identical to those shown in FIG. 1 are denoted by the same reference numerals. The input circuit of FIG. 3 is built into an LSI chip, and inputs a signal input from an external circuit to a pad electrode PAD (a node I/O), from a node OUT to an internal circuit of the LSI chip. An internal power supply VDD of the aforementioned LSI chip is 3[V]. An "H" level of a signal input from the external circuit is 5[V].

The input circuit of FIG. 3 comprises an input terminal IN, an output terminal OUT, PMOS transistors P11 to P17, and P28, NMOS transistors N11 to N15, N26, and N27, and an inverter INV11. Namely, in the input circuit of FIG. 1, the first control circuit is formed by the NMOS transistor N16. In the input circuit of FIG. 3, a first control circuit is formed by PMOS transistor P28, and NMOS transistors N26 and N27, instead.

As for the PMOS transistor P28, a gate electrode thereof is connected to the internal power supply VDD, a source electrode thereof is connected to the node I/O, a drain electrode thereof is connected to a node S11, and a substrate thereof is connected to a node W11. Further, as for the PMOS transistor P17, a gate electrode thereof is connected to the node S11, a drain electrode thereof is connected to the node I/O, a source electrode thereof is connected to the internal power supply VDD, and a substrate thereof is connected to the node W11.

The NMOS transistors N26 and N27 are provided in a series between the node S11 and the ground power supply GND. As for the NMOS transistor N26, a gate electrode thereof is connected to the internal power supply VDD, a drain electrode thereof is connected to the node S11, and a source electrode and a substrate thereof are connected to a node S21. Further, as for the NMOS transistor N27, a gate electrode thereof is connected to the internal power supply VDD, a drain electrode thereof is connected to the node S21, and a source electrode and a substrate thereof are connected to the ground power supply GND.

When the pad electrode PAD is at a "Z" level (high impedance), the aforementioned PMOS transistors P17 and P28 and the NMOS transistors N26 and N27 form a pull-up circuit which causes the potential of the node I/O to be that of the internal power supply VDD. When the pad electrode PAD is at the "Z" level (high impedance), the PMOS transistor P17 functions as a pull-up transistor (a transistor that is ON all the time, whose gate electrode is fixed at the potential of the ground power supply GND).

The aforementioned NMOS transistors N26 and N27 are ON all the time. Further, these NMOS transistors N26 and N27 are provided in a series of two so as to prevent a voltage greater than or equal to the internal power supply VDD from being applied to a source-drain of a single NMOS transistor when a voltage greater than or equal to the internal power supply VDD is input from the external circuit to the pad electrode PAD.

Since an N-well layer, the node W11, which is the substrate of the PMOS transistor P28 is not connected to the internal power supply VDD, even when a voltage greater than or equal to the internal power supply VDD is input from the external circuit to the pad electrode PAD, leakage electric current does not flow from the pad electrode PAD to the internal power supply VDD via a pn junction formed by the substrate, N-well layer, and a source or drain at a side at which the source or the drain is connected to the node I/O.

Next, an operation of the input circuit of FIG. 3 will be explained. When the pad electrode PAD (the node I/O) is at a "L" level (0[V]), the PMOS transistor P28 is OFF, and the node S21 is at the "L" level due to the NMOS transistors N26 and N27 being ON all the time. Since the node S21 is at the "L" level, the PMOS transistor P17 is ON, and electric current flows from the internal power supply VDD to the pad electrode PAD through a source-drain of the PMOS transistor P17.

Also in the input circuit of FIG. 3, in the same manner as the input circuit of FIG. 1, since the drain electrode of the PMOS transistor P15 and the node W11 are separated from each other, when the pad electrode PAD is at the "L" level, the electric current route of [VDD]-[source of P17]-[substrate of P17]-[W11]-[drain of P15]-[S13]-[P12]-[PAD] is not formed so that excess electric current does not flow from the internal power supply VDD to the pad electrode PAD.

After the pad electrode PAD has changed from the "L" level (0[V]) to the "Z" level (high impedance), the potential of the pad electrode PAD (the node I/O) is increased due to the current flowing from the internal power supply VDD to the pad electrode PAD through the source-drain of the PMOS transistor P17, and thereby becomes 3[V], which is the same as that of the internal power supply VDD. Even when the pad electrode PAD has increased to 3[V], since the PMOS transistor P28 remains OFF, the node S11 remains at the "L" level, and the PMOS transistor P17 thereby remains ON.

In a conventional input circuit in FIG. 4, when the pad electrode PAD is at the "Z" level, as the potential of node I/O increases, the potential of the gate (the potential of the node S11) of the PMOS transistor P17 also increases. Accordingly, as compared to a case in which a pull-up transistor having the same dimensions as the PMOS transistor P17 is used, it takes much more time until the potential of the pad electrode PAD reaches the potential of the internal power supply VDD. It was impossible to increase the potential of the pad electrode PAD to that of the internal power supply VDD based on a combination of the threshold voltages of PMOS and NMOS. However, in the input circuit of FIG. 3, since the gate potential of the PMOS transistor P17 is fixed at the "L" level and the PMOS transistor P17 functions as a pull-up transistor, it is possible to increase the potential of the pad electrode PAD (the node I/O) to the potential of the internal power supply VDD, promptly and reliably.

When the pad electrode PAD has changed from the "L" level (0[V]) to the "H" level (5[V]), or from the "Z" level (high impedance) to the "H" level (5[V]), the PMOS transistor P28 turns ON.

By the PMOS transistor P28 being turned ON, the potential of the node S11 increases to a potential determined by a ratio of the ON resistance value of the PMOS transistor P28 to the ON resistance values of the NMOS transistors N26 and N27. The aforementioned ON resistance ratio can be determined so as to prevent a voltage greater than or equal to the internal power supply VDD from being applied to between the gate electrode (the node S11) and the drain electrode (the node I/O) of the PMOS transistor P17. Further, the ON resistance ratio increases the potential of the node S11 to substantially 5[V], which is the same as that of the pad electrode PAD, and switches the PMOS transistor P17 OFF so as to prevent electric current from flowing from the pad electrode PAD to the internal power supply VDD via the drain-source of the PMOS transistor P17.

When the pad electrode PAD has changed from the "H" level (5[V]) to the "Z" level (high impedance), the potential of the pad electrode PAD (the node I/O) decreases due to the current flowing through the PMOS transistor P28 and the NMOS transistors N26 and N27, from the pad electrode PAD to the ground power supply GND, and thereby becomes 3[V], which is the same as that of the internal power supply VDD. Further, the PMOS transistor P28 is switched OFF. Further, the PMOS transistor P17 remains ON (however, if the PMOS transistor P17 is OFF when the pad electrode PAD is at the "H" level (5[V]), the PMOS transistor P17 is switched ON).

In this way, in accordance with the second embodiment of the present invention, the first control circuit for controlling the potential of the node S11 on the basis of the potential of the pad electrode PAD (the node I/O) is formed by the PMOS transistor P28 provided between the node I/O and the node S11, and the NMOS transistors N26 and N27 provided in series between the node S11 and the ground power supply GND. As a result, when the pad electrode PAD is at the "Z" level (high impedance), the potential of the node I/O can be increased to the potential of the internal power supply VDD promptly and reliably.

As described above, in accordance with the I/O circuit of a semiconductor integrated circuit device of the present invention, since a connection of a fourth node and a second electrode of a second MOS transistor, a connection of a first electrode of the second MOS transistor and a first electrode of the third MOS transistor, a connection of a second electrode of the third MOS transistor and a fifth node, or a connection of a second electrode of the fourth MOS transistor and a first power supply is disconnected, an electric current route of [first power supply]-[second electrode of the fourth MOS transistor]-[substrate of the fourth MOS transistor]-[fifth node]-[second electrode of the third MOS transistor]-[second node]-[second MOS transistor]-[fourth node] is not formed. As a result, an excellent effect can be provided wherein since excessive electric current does not flow between the first power supply and the node I/O, electric current consumption can be reduced.

Further, in accordance with another I/O circuit of the semiconductor integrated circuit device, since the first control circuit is formed by a sixth MOS transistor provided between the fourth node and the sixth node, and a seventh and an eighth MOS transistors provided in series between the sixth node and a second power supply, an excellent effect can be obtained in that, when the fourth node is at high impedance, it is possible to increase the potential of the fourth node to the potential of the first power supply, promptly and reliably.

What is claimed is:

1. A method for manufacturing an I/O circuit of a semiconductor device, the method comprising:

forming a first MOS transistor in a semiconductor substrate, the first MOS transistor having a gate electrode connected to a first node to which a first signal is input form at least one of a first power supply and an internal circuit, a first electrode connected to the first power supply, and a second electrode connected to a second node;

forming a second MOS transistor in the semiconductor substrate, the second MOS transistor having a gate electrode connected to a third node, a first electrode, a second electrode connected to a second node, and a substrate connected to a fourth node which is in a floating state;

forming a third MOS transistor in the semiconductor substrate, the third MOS transistor having a gate electrode connected to the third node, a first electrode, a second electrode, and a substrate connected to the fourth node;

forming a fourth MOS transistor in the semiconductor substrate, the fourth MOS transistor having a gate electrode connected to a fifth node, a first electrode connected to a sixth node to which a signal is either input from an external circuit or from which a signal is output to the external circuit, a second electrode, and a substrate connected to the fourth node;

forming a first control circuit in the semiconductor substrate, the first control circuit controlling a potential of the fifth node in accordance with a potential of the sixth node;

forming a second control circuit in the semiconductor substrate, the second control circuit controlling a potential of the third node in accordance with a potential of the sixth node;

connecting the first and second electrodes of the second MOS transistor to the sixth node and the second node, respectively;

connecting one of the first and second electrodes of the third MOS transistor to the second node and setting the other of the first and second electrodes of the third MOS transistor to a floating state which is isolated from the fourth node; and connecting the second electrode of the fourth MOS transistor to the first power supply.

2. A method for manufacturing an I/O circuit of a semiconductor device, the method comprising:

forming a first MOS transistor in a semiconductor substrate, the first MOS transistor having a gate electrode connected to a first node to which a first signal is input from at least one of a first power supply and an internal circuit, a first electrode connected to the first power supply, and a second electrode connected to a second node;

forming a second MOS transistor in the semiconductor substrate, the second MOS transistor having a gate electrode connected to a third node, a first electrode, a second electrode connected to a second node, and a substrate connected to a fourth node which is in a floating state;

forming a third MOS transistor in the semiconductor substrate, the third MOS transistor having a gate electrode connected to the third node, a first electrode, a second electrode, and a substrate connected to the fourth node;

forming a fourth MOS transistor in the semiconductor substrate, the fourth MOS transistor having a gate electrode connected to a fifth node, a first electrode connected to a sixth node to which a signal is either input from an external circuit or from which a signal is output to the external circuit, a second electrode, and a substrate connected to the fourth node;

forming a first control circuit in the semiconductor substrate, the first control circuit controlling a potential of the fifth node in accordance with a potential of the sixth node;

forming a second control circuit in the semiconductor substrate, the second control circuit controlling a potential of the third node in accordance with a potential of the sixth node;

connecting one of the first and second electrodes of the second MOS transistor to the sixth node and setting the other of the first and second electrodes of the second MOS transistor to a floating state which is isolated from the sixth node;

connecting the first and second electrodes of the third MOS transistor to the second node and the fourth node, respectively; and connecting the second electrode of the fourth MOS transistor to the first power supply.

3. A method for manufacturing an I/O circuit of a semiconductor device, the method comprising:

forming a first MOS transistor in a semiconductor substrate, the first MOS transistor having a gate electrode connected to a first node to which a first signal is input from at least one of a first power supply and an internal circuit, a first electrode connected to the first power supply, and a second electrode connected to a second node;

forming a second MOS transistor in the semiconductor substrate, the second MOS transistor having a gate electrode connected to a third node, a first electrode, a second electrode connected to a second node, and a substrate connected to a fourth node which is in a floating state;

forming a third MOS transistor in the semiconductor substrate, the third MOS transistor having a gate electrode connected to the third node, a first electrode, a second electrode, and a substrate connected to the fourth node;

forming a fourth MOS transistor in the semiconductor substrate, the fourth MOS transistor having a gate electrode connected to a fifth node, a first electrode connected to a sixth node to which a signal is either input from an external circuit or from which a signal is output to the external circuit, a second electrode, and a substrate connected to the fourth node;

forming a first control circuit in the semiconductor substrate, the first control circuit controlling a potential of the fifth node in accordance with a potential of the sixth node;

forming a second control circuit in the semiconductor substrate, the second control circuit controlling a potential of the third node in accordance with a potential of the sixth node;

connecting the first and second electrodes of the second MOS transistor to the sixth node and the second node, respectively;

connecting the first and second electrodes of the third MOS transistor to the second node and the fourth node, respectively;

connecting the first electrode of the fourth MOS transistor to the sixth node; and setting the second electrode of the fourth MOS transistor to a floating state which is isolated from the first power supply.

* * * * *